US009461139B1

(12) United States Patent
Liu

(10) Patent No.: US 9,461,139 B1
(45) Date of Patent: Oct. 4, 2016

(54) LATERAL BIPOLAR JUNCTION TRANSISTOR (BJT) ON A SILICON-ON-INSULATOR (SOI) SUBSTRATE

(71) Applicant: STMicroelectronics, Inc., Coppell, TX (US)

(72) Inventor: Qing Liu, Watervliet, NY (US)

(73) Assignee: STMICROELECTRONICS, INC., Coppell, TX (US)

( * ) Notice: Subject to any disclaimer, the term of this patent is extended or adjusted under 35 U.S.C. 154(b) by 0 days.

(21) Appl. No.: 14/722,522

(22) Filed: May 27, 2015

(51) Int. Cl.
| | |
|---|---|
| *H01L 29/66* | (2006.01) |
| *H01L 29/06* | (2006.01) |
| *H01L 21/265* | (2006.01) |
| *H01L 29/10* | (2006.01) |
| *H01L 21/02* | (2006.01) |
| *H01L 29/735* | (2006.01) |

(52) U.S. Cl.
CPC ..... *H01L 29/6625* (2013.01); *H01L 21/02554* (2013.01); *H01L 21/26513* (2013.01); *H01L 29/0649* (2013.01); *H01L 29/1008* (2013.01); *H01L 29/735* (2013.01)

(58) Field of Classification Search
None
See application file for complete search history.

(56) References Cited

U.S. PATENT DOCUMENTS

| | | | |
|---|---|---|---|
| 5,298,786 A | 3/1994 | Shahidi et al. | |
| 8,288,758 B2* | 10/2012 | Ning | H01L 29/0808 257/19 |
| 8,557,670 B1 | 10/2013 | Cai et al. | |
| 8,558,282 B1* | 10/2013 | Cai | H01L 29/6625 257/197 |
| 9,059,016 B1* | 6/2015 | Hekmatshoar-Tabari | H01L 29/0804 |
| 2006/0060941 A1 | 3/2006 | Sun et al. | |

OTHER PUBLICATIONS

Ning, Tak H., and Jin Cai. "On the Performance and Scaling of Symmetric Lateral Bipolar Transistors on SOI." IEEE J. Electron Devices Soc. IEEE Journal of the Electron Devices Society 1.1 (2013): 21-27.*

* cited by examiner

*Primary Examiner* — Joseph Schoenholtz
(74) *Attorney, Agent, or Firm* — Gardere Wynne Sewell LLP

(57) ABSTRACT

A bipolar transistor is supported by a substrate including a semiconductor layer overlying an insulating layer. A transistor base is formed by a base region in the semiconductor layer that is doped with a first conductivity type dopant at a first dopant concentration. The transistor emitter and collector are formed by regions doped with a second conductivity type dopant and located adjacent opposite sides of the base region. An extrinsic base includes an epitaxial semiconductor layer in contact with a top surface of the base region. The epitaxial semiconductor layer is doped with the first conductivity type dopant at a second dopant concentration greater than the first dopant concentration. Sidewall spacers on each side of the extrinsic base include an oxide liner on a side of the epitaxial semiconductor layer and the top surface of the base region.

32 Claims, 5 Drawing Sheets

LATERAL BIPOLAR JUNCTION TRANSISTOR (BJT) ON A SILICON-ON-INSULATOR (SOI) SUBSTRATE

JOINT RESEARCH AGREEMENT

The claimed configurations set forth herein were made as a result of activities undertaken within the scope of a joint research agreement. The parties to the joint research agreement are (1) STMicroelectronics, Inc. and (2) International Business Machines Corporation.

TECHNICAL FIELD

The present invention relates to integrated circuits and, in particular, to a semiconductor transistor device of the lateral bipolar junction transistor (BJT) type.

BACKGROUND

Reference is now made to FIG. 1 showing the general configuration of a conventional lateral bipolar junction transistor (BJT) 10 device. A silicon-on-insulator substrate 12 supports the transistor. The substrate 12 includes a substrate layer 14, a buried oxide (BOX) layer 16 and a semiconductor layer 18. An active region 20 for the transistor device is delimited by a peripherally surrounding shallow trench isolation 22 which penetrates through the layer 18. Within the active region 20, the layer 18 is divided into a base region 30 which has been doped with a first conductivity type dopant, an emitter region 32 (adjacent the base region 30 on one side) which has been doped with a second conductivity type dopant, and a collector region 34 (adjacent the base region 30 on an opposite side from the emitter region 32) which has also been doped with the second conductivity type dopant. Where the BJT 10 device is of the npn-type, the first conductivity type dopant is p-type and the second conductivity type is n-type. Conversely, where the BJT device is of the pnp-type, the first conductivity type dopant is n-type and the second conductivity type is p-type. An extrinsic base region 36 is provided above the base region 30. This extrinsic base region 36 typically comprises polysilicon material and is heavily doped with the same conductivity type dopant as the base region 30 provided in the layer 18. Sidewall spacers 38 made of an insulating material such as silicon nitride (SiN) are provided on the sides of the extrinsic base region 36 and serve to protect against shorting of the emitter (E) or collector (C) to the base (B).

There are a few concerns with the BJT 10 device as shown in FIG. 1. One concern is that it is difficult to heavily dope the polysilicon material used for the extrinsic base region 36. A high dopant concentration in the extrinsic base region 36 is difficult to achieve without risking adversely impacting the dopant in the base region 30. Another concern is that a too high interfacial density of state (Dit) condition exists at the bottom of the silicon nitride sidewall spacers 38 on the layer 18 which overlap the interface between the emitter/collector regions and the base region 30.

A need accordingly exists in the art for an improved configuration of a lateral BJT device implemented on an SOI substrate.

SUMMARY

In an embodiment, a bipolar transistor device comprises: a substrate including a semiconductor layer overlying an insulating layer; a transistor base comprising a base region in the semiconductor layer doped with a first conductivity type dopant at a first dopant concentration; a transistor emitter comprising an emitter region doped with a second conductivity type dopant and located adjacent one side of the base region; a transistor collector comprising a collector region doped with the second conductivity type dopant and located adjacent an opposite side of the base region; and an extrinsic base comprising an epitaxial semiconductor layer in contact with a top surface of the base region, said epitaxial semiconductor layer doped with the first conductivity type dopant at a second dopant concentration greater than the first dopant concentration.

In an embodiment, a method comprises: epitaxially growing an epitaxial semiconductor layer from a top surface of a semiconductor layer overlying an insulating layer, said semiconductor layer doped with a first conductivity type dopant at a first dopant concentration, and said epitaxial semiconductor layer doped with the first conductivity type dopant at a second dopant concentration greater than the first dopant concentration; patterning the epitaxial semiconductor layer to define an extrinsic base in contact with a transistor base comprising a base region of the semiconductor layer; forming a transistor emitter comprising an emitter region doped with a second conductivity type dopant and located adjacent one side of the base region; and forming a transistor collector comprising a collector region doped with the second conductivity type dopant and located adjacent an opposite side of the base region.

BRIEF DESCRIPTION OF THE DRAWINGS

For a better understanding of the embodiments, reference will now be made by way of example only to the accompanying figures in which.

DETAILED DESCRIPTION OF THE DRAWINGS

Reference is now made to FIGS. 2-13 which illustrate the process steps in the formation of an improved lateral BJT device. It will be understood that the drawings do not necessarily show features drawn to scale.

Figure 2:
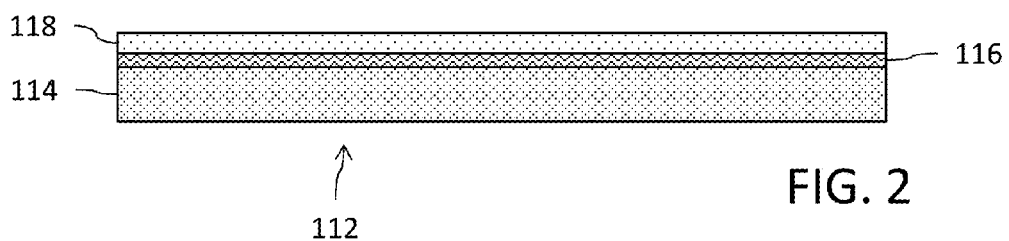
FIGS. 2-13 illustrate process steps in the formation of an improved lateral BJT device.

FIG. 2 shows a silicon on insulator (SOI) semiconductor substrate 112 comprising a semiconductor substrate 114, an insulating layer 116 and a silicon semiconductor layer 118 in a stack. The silicon semiconductor layer 118 may be doped in accordance with the application, or alternatively may be un-doped in which case the SOI substrate 112 is of the "fully-depleted" type. The semiconductor layer 118 may, for example, have a thickness of 6-12 nm. The insulating layer 116 is commonly referred to in the art as a buried oxide (BOX) layer and has a thickness of 10-30 nm.

In an alternative embodiment, the semiconductor layer 118 may be formed of a different semiconductor material such as silicon-germanium (SiGe).

Figure 3:
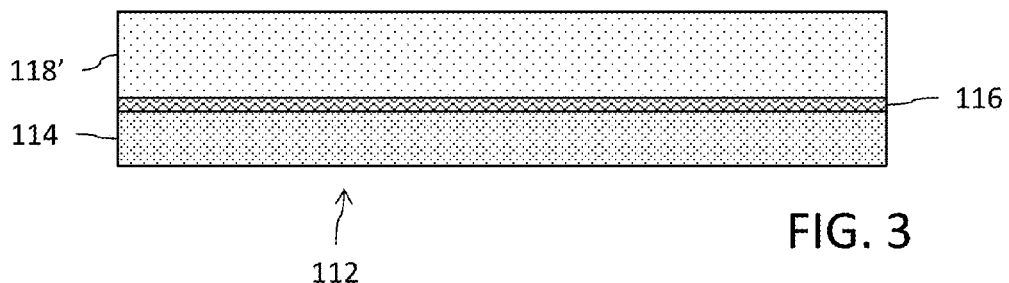

An epitaxial growth or deposition process as known in the art is then used to increase the thickness of the semiconductor layer 118'. The layer 118' may, for example have a thickness of 30-100 nm and is made of silicon (or alternatively, silicon-germanium). An implant of a dopant of a first conductivity type is made into the layer 118'. The implanted dopant is activated using an anneal. Alternatively, an in-situ doping process may be used during epitaxy. The dopant may, for example, have a concentration of $5 \times 10^{18}$ to $1 \times 10^{19}$ at/cm$^3$. The result is shown in FIG. 3.

Figure 4:
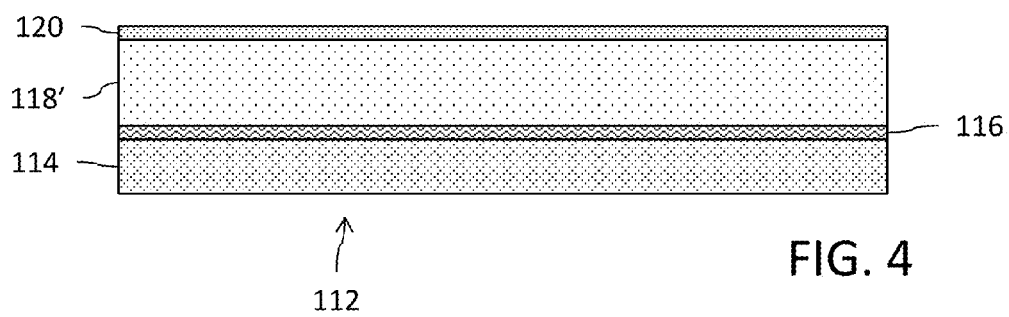

Next, an epitaxial growth process as known in the art is used to grow an epitaxial silicon layer 120 on the semiconductor layer 118'. The layer 120 may, for example have a thickness of about 5 nm (for example, in the range of 3-10 nm). The layer 120 is also doped with the first conductivity type dopant, but the doping concentration in layer 120 is heavier (greater) than the doping concentration in layer 118'. For example, the layer 120 may have a heavy doping concentration of $2 \times 10^{20}$ to $1 \times 10^{21}$ at/cm$^3$. The layer 120 is preferably in-situ doped. The result is shown in FIG. 4. It is advantageous for the layer 120 to be relatively thin (such as in the range of 3-10 nm) because a thin layer can be more precisely etched during subsequent processing steps.

Again, in an alternative embodiment, the layer 120 may for formed of a different semiconductor material such as silicon-germanium (SiGe).

Figure 5:
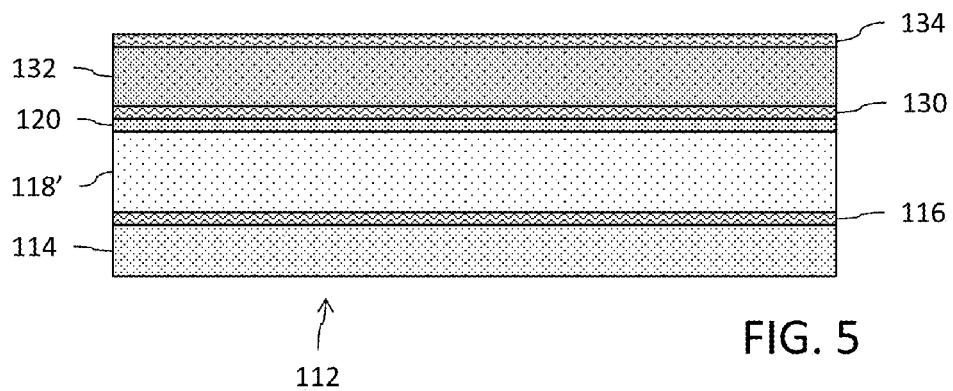

A pad oxide layer 130 is then provided on top of the layer 120. The pad oxide layer 130 may, for example, have a thickness of 3-5 nm and be grown (for example, using a thermal oxidation) or deposited (for example, using chemical vapor deposition or atomic layer deposition). A chemical vapor deposition process is then used to deposit a polysilicon layer 132 on the pad oxide layer 130. This polysilicon layer 132 may have a thickness of 40-80 nm and may, or may not, be doped. A hard mask layer 134, for example of silicon nitride, is then deposited on the polysilicon layer 132 using a chemical vapor deposition process with a thickness of 20-40 nm. The result is shown in FIG. 5.

Figure 6:
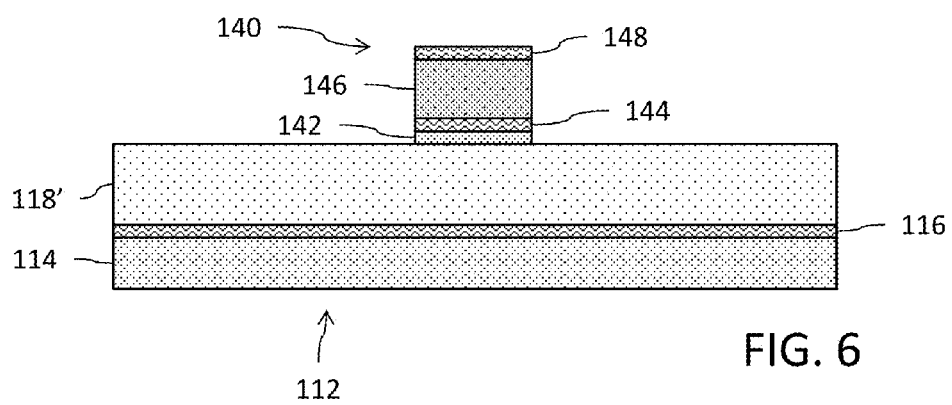

A lithographic process as known in the art is then used to define a base stack 140 from the heavily doped silicon layer 120, pad oxide layer 130, polysilicon layer 132 and hard mask layer 134. The base stack 140 includes a (thin) base contact 142 formed from the heavily doped silicon layer 120, a sacrificial pad 144 formed from the pad oxide layer 130, a sacrificial polysilicon contact 146 formed from the polysilicon layer 132 and a sacrificial cap 148 formed from the hard mask layer 134. The result is shown in FIG. 6. The etch(es) used for defining the base stack 140 should preferably stop at the top surface of the semiconductor layer 118'.

Figure 7:
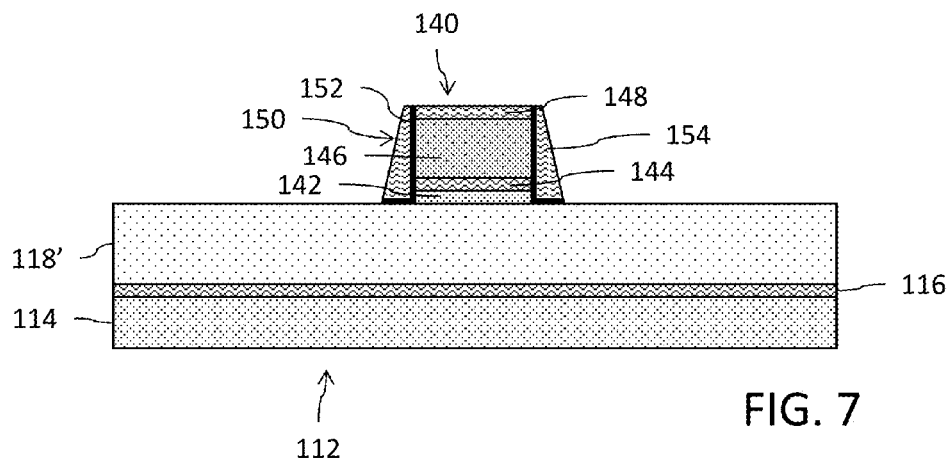

Sidewall spacers 150 are then formed on the base stack 140. The sidewall spacers 150 include a layer 152 of silicon dioxide (SiO$_2$) deposited using atomic layer deposition with a thickness of about 3 nm (for example, between 2-5 nm) followed by a layer 154 of silicon nitride (SiN), or other low-k dielectric material such as SiBCN, SiOCN, or the like, deposited using atomic layer deposition with a thickness of 6-12 nm. Importantly, the layer 152 is provided not only on the sides of the base stack 140 but also on the top surface of the semiconductor layer 118'. A first etch is performed to preferentially remove the layer 154 from horizontal surfaces, followed by a second etch which removes the portions of layer 152 which are not covered by the previously etched layer 154. The result is shown in FIG. 7.

Figure 8A:
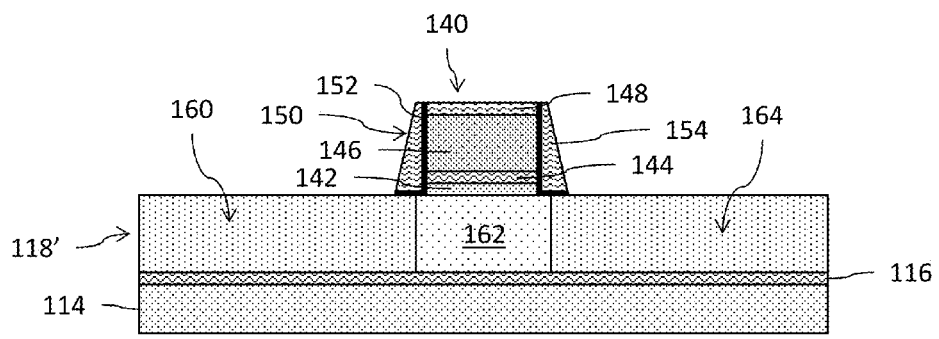

Next, a dopant implantation process is performed to implant dopant of the second conductivity type into the layer 118' using the base stack 140 with sidewall spacers 150 as a mask. The implanted dopant is activated using an anneal to form an emitter region 160 in the layer 118' on one side of a base region 162 (doped with the first conductivity type dopant) located underneath the base stack 140 with sidewall spacers 150 and further form a collector region 164 on the opposite side of the base region 162. The dopant may, for example, have a concentration of $1 \times 10^{20}$ to $5 \times 10^{20}$ at/cm$^3$. The result is shown in FIG. 8A. Note that activation of the dopant results in extension of the emitter region 160 and collector region 164 partially underneath of the sidewall spacers.

Figure 8B:
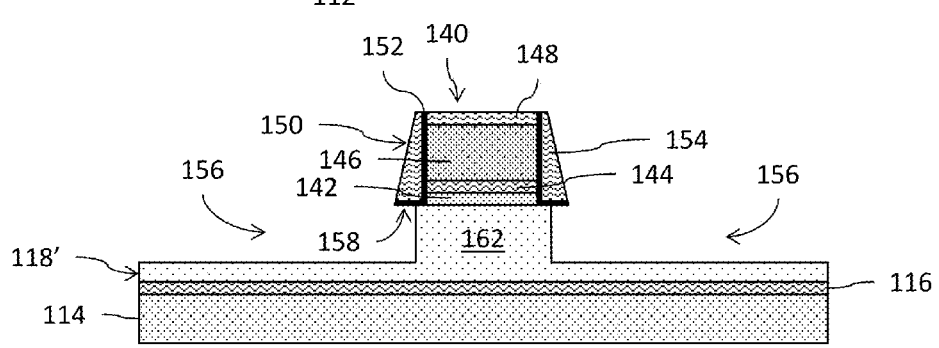

In an alternative implementation, an etch is performed using the base stack 140 with sidewall spacers 150 as a mask to recess the semiconductor layer 118' in regions 156 on each side of the base stack 140 with sidewall spacers 150 so as to leave an underlying base region 162 (doped with the first conductivity type dopant). The etch may comprise, for example, a dry etch process. It will be noted that the etch may be configured to remove material of semiconductor layer 118' from underneath the sidewall spacers 150 thus forming an undercut 158 on each side of the base region 162. The result is shown in FIG. 8B. It will be noted that the recess does not necessarily remove all of semiconductor layer 118' associated with regions 156. In an embodiment, however, all of semiconductor layer 118' down to the oxide layer 116 may be removed in regions 156.

Figure 8C:
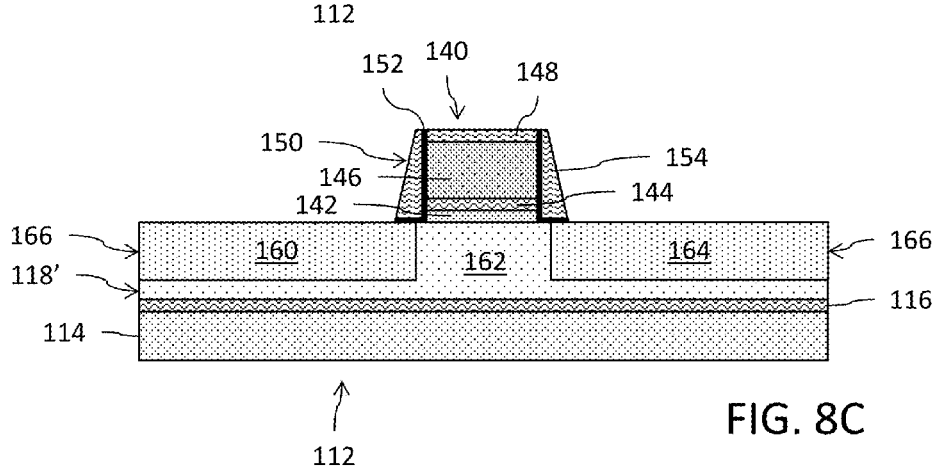

Further to this alternative implementation, an epitaxial growth process as known in the art is used to grow epitaxial silicon material 166 in the regions 156 from the remaining portions of the semiconductor layer 118'. The epitaxially grown material 166 is doped with the second conductivity type dopant. For example, the material may have a doping concentration of $1 \times 10^{20}$ to $5 \times 10^{20}$ at/cm$^3$. The material is preferably in-situ doped. The result is shown in FIG. 8C with the doped epitaxial material 166 forming the emitter region 160 on one side of the base region 162 and the collector region 164 on the opposite side of the base region 162. Although the epitaxial growth of material 166 is illustrated as terminating at a same height as the base region portion of the semiconductor layer 118', it will be understood that the growth could be continued if desired to provide raised emitter and collector regions have a height extending to contact the sides of the sidewall spacers.

Where an npn-type BJT device is being formed, the first conductivity type dopant is p-type and the second conductivity type is n-type. Conversely, where a pnp-type BJT device is being formed, the first conductivity type dopant is n-type and the second conductivity type is p-type.

In the following discussion of the fabrication process, the figures show the implementation as in FIG. 8A, but it will be understood that the description is equally applicable to the implementation as shown in FIG. 8C.

Figure 9:
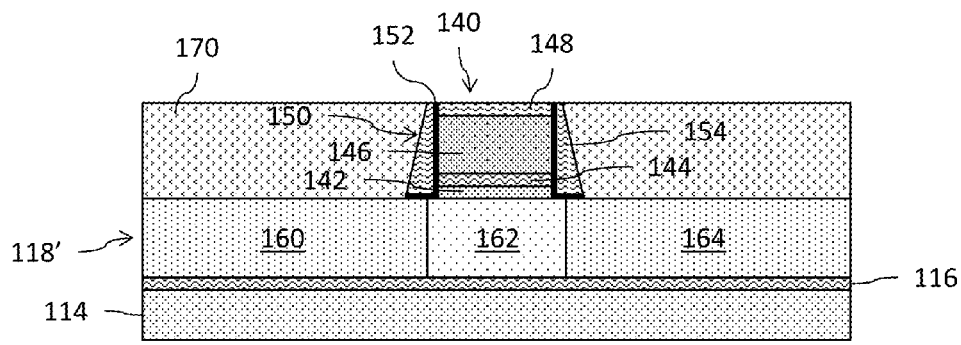

A layer 170 of a flowable insulating material, such as a flowable silicon dioxide, is deposited to cover the substrate, base stack 140 and sidewall spacers 150. A chemical mechanical polishing operation is performed to planarize the layer 170 at the sacrificial cap 148 of the base stack 140. The result is shown in FIG. 9.

Figure 10:
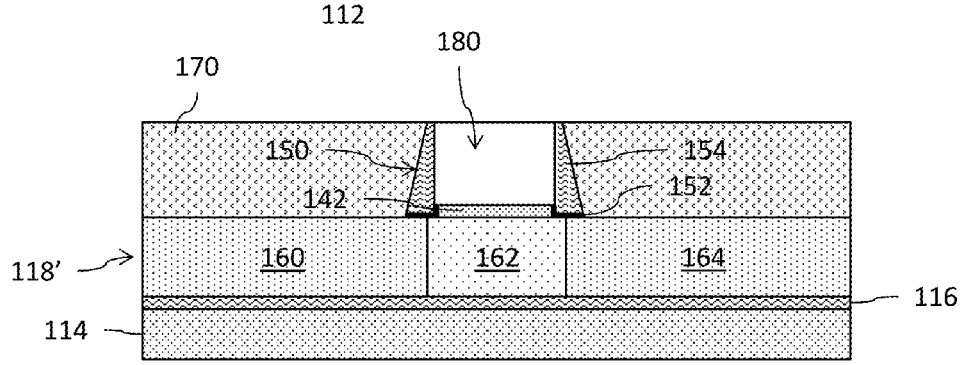

A first etch, for example, a dry etch, is then performed to remove the sacrificial cap 148. A second etch, for example, a wet etch, is then performed to remove the sacrificial polysilicon contact 146. A third etch, for example, a wet etch, is then performed to remove the sacrificial pad 144 as well as portions of the layer 152 above the heavily doped base contact 142. The result is shown in FIG. 10 to open a base contact aperture 180. The etch chemistries are specifically chosen to be selective so as to minimize or eliminate attack on the layer 154, layer 170 and heavily doped base contact 142.

It will be noted that when etching to remove the sacrificial pad 144, a partial etching of the layer 170 will also occur. This is of no consequence and subsequence planarization can address any non-uniformity in thickness.

Figure 11:
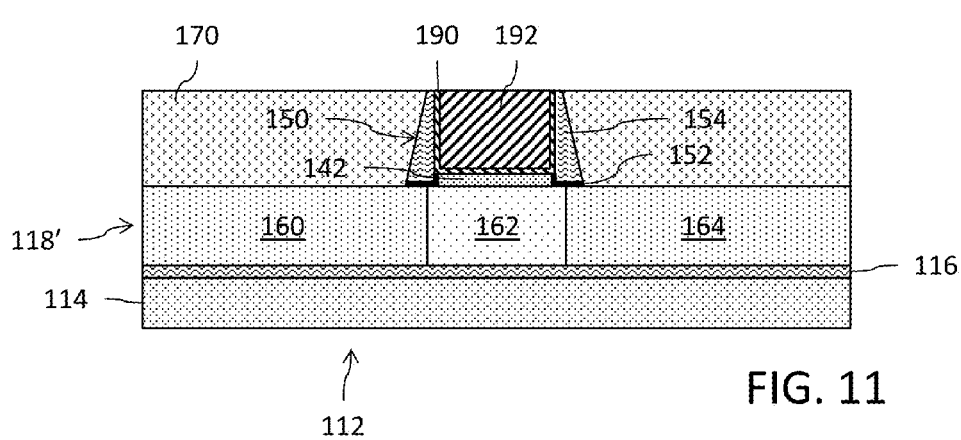

A metal liner 190 is then deposited on the sidewalls and floor of the aperture 180. The metal liner may, for example, comprise titanium (Ti) deposited using a plasma vapor deposition process with a thickness of 3-10 nm. The metal liner may alternatively comprise an alloy of nickel and platinum (NiPt) deposited using a plasma vapor deposition process with a thickness of 3-10 nm. A metal fill 192 is then deposited to fill the aperture 180. The metal fill may, for example, comprise tungsten (W) deposited using a plasma vapor deposition process. A chemical mechanical polishing operation is performed to remove any portions of the liner 190 and fill 192 which are present on top of the layer 170. The result is shown in FIG. 11.

Figure 12:
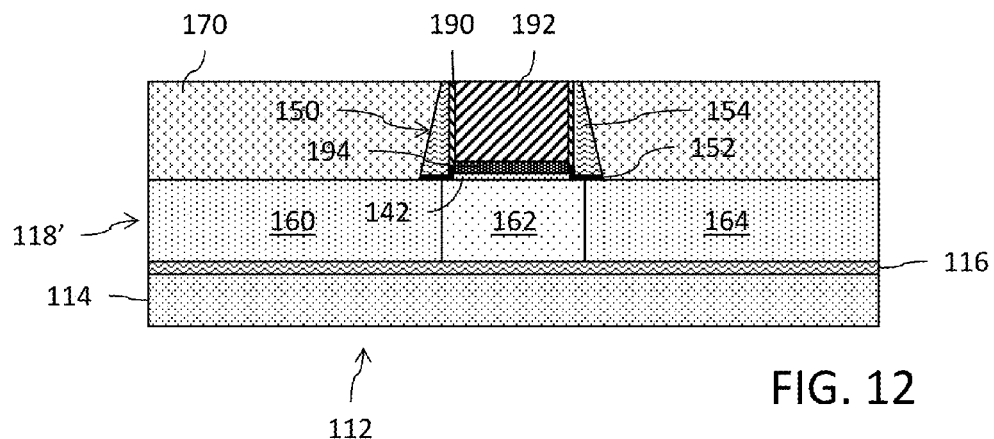

An anneal process may then be performed to convert at least a portion of the heavily doped base contact 142 in contact with the metal liner 190 at the floor of the aperture 180 to a metal silicide 194. The result is shown in FIG. 12.

The layer 170 is extended to form a pre-metal dielectric (PMD) layer 172. A chemical mechanical polishing operation is performed to planarize the layer 172. Contact openings 174 are then formed to extend through the layer 172 to reach the emitter region 160, metal fill 192 (contacting the base region 162) and collector region 164. The contact openings are then filled with a metal material 176, for example, tungsten, to make electrical connection to the emitter, base and collector terminals of a lateral BJT device 178 formed by the emitter region 160, base region 162 and collector region 164. It will be understood that the contact openings 174 may be lined with a metal material (such as NiPt) which supports the formation of silicide regions (not explicitly shown) at the interface with the emitter region 160 and collector region 164 if desired.

Figure 13:
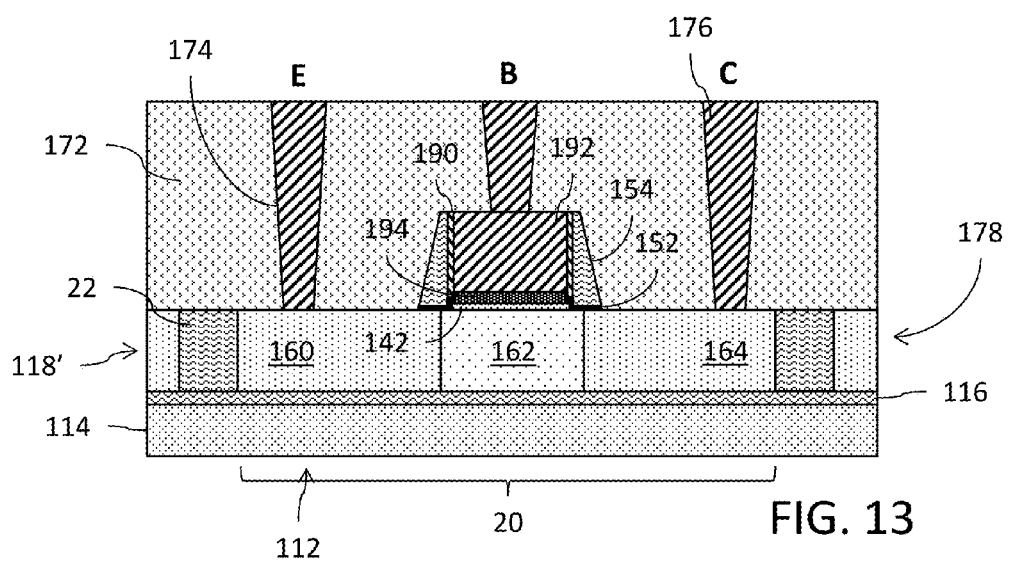

FIG. 13 further shows the presence of shallow trench isolation structures 22 which peripherally delimit an active area 20 for the lateral BJT device 178. The shallow trench isolation structures 22 may be formed at any suitable time in accordance with processes well known to those skilled in the art. For example, the structures 22 may be formed at or around the point in the fabrication process where layer 118' is provided.

Figure 1:
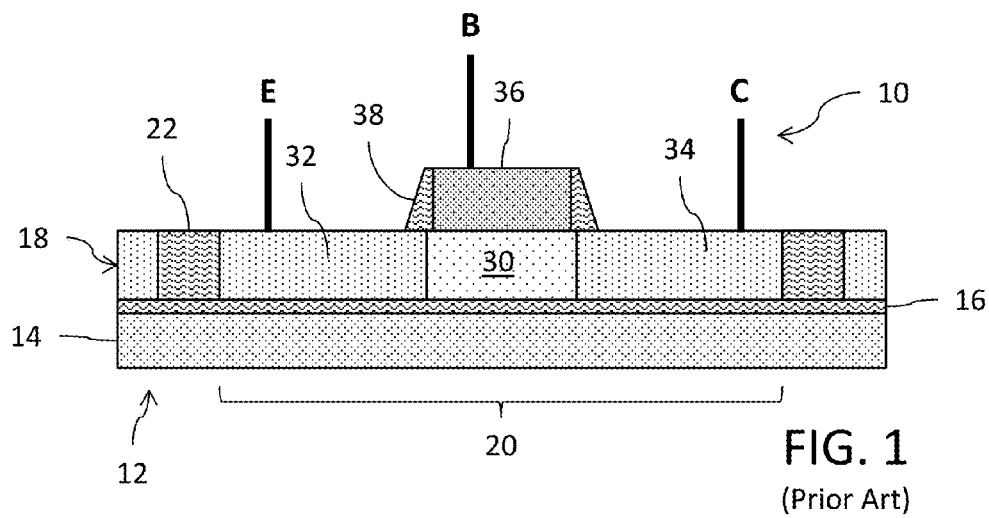
FIG. 1 illustrates the configuration of a prior art lateral bipolar junction transistor (BJT) device.

The BJT device 178 produced as described above and shown in FIG. 13 addresses the noted concerns with the prior art device of FIG. 1. First, the heavily doped portion of the extrinsic base is provided by patterning the in situ doped epitaxial silicon layer 120 to form the heavily doped base contact 142. This avoids issues surrounding efforts to heavily dope polysilicon as in the prior art. Second, the provision of silicon dioxide layer 152 in the sidewall spacers 150 provides for a lower interfacial density of states (Dit) at the bottom of the sidewall spacers 150 on the layer 118' at the interface between the emitter/collector regions and the base region 162.

The thin heavily doped base contact 142 is advantageous because it serves to minimize the impact on base doping and further improve drive current. The presence of the SiO$_2$ layer in the sidewalls reduces Dit and can further lead to higher current capacity and lower device leakage.

A further advantage is that the process for formation of the lateral BJT device is fully compatible with industry processes known to those skilled in the art for the use of replacement metal gate (RMG) techniques used in CMOS integrated circuit fabrication (for example, in connection with the fabrication of MOSFET devices or FinFET devices with the replacement metal gate technique being performed on both the CMOS and BJT devices in the same set of process steps). This enables the lateral BJT and MOSFET/FinFET CMOS devices to be co-integrated on a common substrate (for example, with the BJT devices being used in input/output circuitry while CMOS devices are used in other/core circuitry). The technique disclosed herein for lateral BJT device fabrication is further scalable to smaller geometry nodes as CMOS process geometries continue to shrink.

The embodiment disclosed herein for recessing the emitter and collector regions followed by epitaxial regrowth (with in situ doping) can advantageously be used to form lateral BJT devices exhibiting a higher active doping concentration in the emitter/collector regions as well as provide emitter/collector regions with a germanium content. An improvement in BJT device efficiency results.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

What is claimed is:

1. A bipolar transistor device, comprising:
   a substrate including a semiconductor layer overlying an insulating layer;
   a transistor base comprising a base region in the semiconductor layer doped with a first conductivity type dopant at a first dopant concentration;
   a transistor emitter comprising an emitter region doped with a second conductivity type dopant and located adjacent one side of the base region;
   a transistor collector comprising a collector region doped with the second conductivity type dopant and located adjacent an opposite side of the base region; and
   an extrinsic base comprising an epitaxial semiconductor layer in contact with a top surface of the base region, said epitaxial semiconductor layer doped with the first conductivity type dopant at a second dopant concentration greater than the first dopant concentration, wherein the epitaxial semiconductor layer of the extrinsic base has a thickness of between 3-10 nm.

2. The device of claim 1, wherein the semiconductor layer comprises a silicon material.

3. The device of claim 1, wherein the emitter region and collector region are formed by the semiconductor layer.

4. The device of claim 1, wherein the emitter region and collector region are epitaxial regions grown from the semiconductor layer.

5. The device of claim 1, wherein the extrinsic base further comprises a silicide portion of said epitaxial semiconductor layer.

6. The device of claim 5, wherein the extrinsic base further comprises a metal material in contact with the silicide portion.

7. The device of claim 1, wherein the extrinsic base further comprises a metal material in contact with the epitaxial semiconductor layer.

8. A bipolar transistor device, comprising:
   a substrate including a semiconductor layer overlying an insulating layer;
   a transistor base comprising a base region in the semiconductor layer doped with a first conductivity type dopant at a first dopant concentration;
   a transistor emitter comprising an emitter region doped with a second conductivity type dopant and located adjacent one side of the base region;

a transistor collector comprising a collector region doped with the second conductivity type dopant and located adjacent an opposite side of the base region;

an extrinsic base comprising an epitaxial semiconductor layer in contact with a top surface of the base region, said epitaxial semiconductor layer doped with the first conductivity type dopant at a second dopant concentration greater than the first dopant concentration; and sidewall spacers on each side of the extrinsic base, said sidewall spacers comprising:
  an oxide layer in contact with a side of the epitaxial semiconductor layer and the top surface of the base region; and
  a nitride spacer in contact with the oxide layer on each side of the extrinsic base.

9. A method, comprising:
epitaxially growing an epitaxial semiconductor layer from a top surface of a semiconductor layer overlying an insulating layer, said semiconductor layer doped with a first conductivity type dopant at a first dopant concentration, and said epitaxial semiconductor layer doped with the first conductivity type dopant at a second dopant concentration greater than the first dopant concentration;

patterning the epitaxial semiconductor layer to define an extrinsic base in contact with a transistor base comprising a base region of the semiconductor layer, wherein the epitaxial semiconductor layer of the extrinsic base has a thickness of between 3-10 nm;

forming a transistor emitter comprising an emitter region doped with a second conductivity type dopant and located adjacent one side of the base region; and forming a transistor collector comprising a collector region doped with the second conductivity type dopant and located adjacent an opposite side of the base region.

10. The method of claim 9, further comprising:
forming sidewall spacers on each side of the extrinsic base; and
using the extrinsic base and sidewall spacers as a mask in forming the emitter and collector regions.

11. The method of claim 10, wherein forming the emitter and collector regions comprises implanting dopant of the second conductivity type into the semiconductor layer.

12. The method of claim 10, wherein forming the emitter and collector regions comprises:
removing at least a portion of the semiconductor layer on each side of the extrinsic base and sidewall spacers to produce recessed semiconductor regions; and
epitaxially growing the emitter and collector regions from the recessed semiconductor regions.

13. A method, comprising:
epitaxially growing an epitaxial semiconductor layer from a top surface of a semiconductor layer overlying an insulating layer, said semiconductor layer doped with a first conductivity type dopant at a first dopant concentration, and said epitaxial semiconductor layer doped with the first conductivity type dopant at a second dopant concentration greater than the first dopant concentration;

patterning the epitaxial semiconductor layer to define an extrinsic base in contact with a transistor base comprising a base region of the semiconductor layer;

forming a transistor emitter comprising an emitter region doped with a second conductivity type dopant and located adjacent one side of the base region;

forming a transistor collector comprising a collector region doped with the second conductivity type dopant and located adjacent an opposite side of the base region;

forming sidewall spacers on each side of the extrinsic base; and using the extrinsic base and sidewall spacers as a mask in forming the emitter and collector regions;

wherein forming sidewall spacers comprises:
  depositing an oxide layer in contact with a side of the epitaxial semiconductor layer and the top surface of the semiconductor layer at the base region; and
  forming a nitride spacer in contact with the oxide layer on each side of the extrinsic base.

14. The method of claim 9, further comprising siliciding a portion of said epitaxial semiconductor layer.

15. The method of claim 14, further comprising forming a metal portion of the extrinsic base in contact with the silicided portion.

16. The method of claim 9, further comprising forming a metal portion of the extrinsic base in contact with the epitaxial semiconductor layer.

17. A method, comprising:
epitaxially growing an epitaxial semiconductor layer from a top surface of a semiconductor layer overlying an insulating layer, said semiconductor layer doped with a first conductivity type dopant at a first dopant concentration, and said epitaxial semiconductor layer doped with the first conductivity type dopant at a second dopant concentration greater than the first dopant concentration;

patterning the epitaxial semiconductor layer to define an extrinsic base in contact with a transistor base comprising a base region of the semiconductor layer;

forming a transistor emitter comprising an emitter region doped with a second conductivity type dopant and located adjacent one side of the base region; and forming a transistor collector comprising a collector region doped with the second conductivity type dopant and located adjacent an opposite side of the base region;

forming a polysilicon extrinsic base region over the extrinsic base made from the patterned epitaxial semiconductor layer;

forming sidewall spacers on each side of the extrinsic base and polysilicon extrinsic base region; and using the extrinsic base, polysilicon extrinsic base region and sidewall spacers as a mask in forming the emitter and collector regions.

18. The method of claim 17, wherein forming the emitter and collector regions comprises implanting dopant of the second conductivity type into the semiconductor layer.

19. The method of claim 17, wherein forming the emitter and collector regions comprises:
removing at least a portion of the semiconductor layer on each side of the extrinsic base and sidewall spacers to produce recessed semiconductor regions; and
epitaxially growing the emitter and collector regions from the recessed semiconductor regions.

20. The method of claim 17, further comprising removing the polysilicon extrinsic base region and replacing the removed polysilicon extrinsic base region with a replacement metal gate.

21. The method of claim 20, further comprising forming CMOS structures, and wherein the process for replacing is compatible with a replacement metal gate process performed for the CMOS structures.

22. The device of claim 8, wherein the semiconductor layer comprises a silicon material.

23. The device of claim 8, wherein the emitter region and collector region are formed by the semiconductor layer.

24. The device of claim 8, wherein the emitter region and collector region are epitaxial regions grown from the semiconductor layer.

25. The device of claim 8, wherein the extrinsic base further comprises a silicide portion of said epitaxial semiconductor layer.

26. The device of claim 25, wherein the extrinsic base further comprises a metal material in contact with the silicide portion.

27. The device of claim 8, wherein the extrinsic base further comprises a metal material in contact with the epitaxial semiconductor layer.

28. The method of claim 13, wherein forming the emitter and collector regions comprises implanting dopant of the second conductivity type into the semiconductor layer.

29. The method of claim 13, wherein forming the emitter and collector regions comprises:

removing at least a portion of the semiconductor layer on each side of the extrinsic base and sidewall spacers to produce recessed semiconductor regions; and epitaxially growing the emitter and collector regions from the recessed semiconductor regions.

30. The method of claim 13, further comprising siliciding a portion of said epitaxial semiconductor layer.

31. The method of claim 30, further comprising forming a metal portion of the extrinsic base in contact with the silicided portion.

32. The method of claim 13, further comprising forming a metal portion of the extrinsic base in contact with the epitaxial semiconductor layer.

* * * * *